United States Patent
Ring et al.

(10) Patent No.: US 11,307,773 B1
(45) Date of Patent: Apr. 19, 2022

(54) MEMORY-BASED POWER STABILIZATION IN A NETWORK DEVICE

(71) Applicant: Innovium, Inc., San Jose, CA (US)

(72) Inventors: Keith Michael Ring, Daly City, CA (US); Mohammad Kamel Issa, Los Altos, CA (US)

(73) Assignee: Innovium, Inc., San Jose, CA (US)

( * ) Notice: Subject to any disclaimer, the term of this patent is extended or adjusted under 35 U.S.C. 154(b) by 294 days.

(21) Appl. No.: 16/374,530

(22) Filed: Apr. 3, 2019

Related U.S. Application Data

(60) Provisional application No. 62/665,946, filed on May 2, 2018.

(51) Int. Cl.
　　*G06F 3/06*　　(2006.01)
　　*G11C 15/04*　　(2006.01)
　　(Continued)

(52) U.S. Cl.
　　CPC .......... *G06F 3/0614* (2013.01); *G06F 3/0659* (2013.01); *G06F 3/0673* (2013.01);
　　(Continued)

(58) Field of Classification Search
　　CPC .............. G06F 1/00–3296; G06F 3/00; G06F 3/06–0689; G06F 5/00–16;
　　(Continued)

(56) References Cited

U.S. PATENT DOCUMENTS 3,839,704 A * 10/1974 Spencer .............. G06F 12/0862
　　　　　　　　　　　　　　　　　711/117
5,781,781 A *  7/1998 Marzolf .................... G06F 1/26
　　　　　　　　　　　　　　　　　323/283
(Continued)

OTHER PUBLICATIONS

Definition of Router; computerhope.com; May 13, 2016; retrieved from http://web.archive.org/web/20160513202719/https://www.computerhope.com/jargon/r/router.htm on Apr. 7, 2021 (Year: 2016).*
(Continued)

*Primary Examiner* — Daniel C. Chappell
(74) *Attorney, Agent, or Firm* — Wong & Rees LLP

(57) ABSTRACT

According to an embodiment, power demands of a computing device or component thereof may be stabilized by performing redundant operations during periods of otherwise low power demand. In so doing, the current load of the device/component remains relatively stable, potentially greatly reducing voltage droops and overshoots. This can reduce the peak voltage and peak power rating of the device/component. In certain embodiments, such as in network switches and routers, the redundant operations may include queries against a content addressable memory (CAM), such as a ternary content addressable memory (TCAM). Moreover, in an embodiment the queries may be designed to always, or at least be highly likely to, miss the entries in the CAM, thereby ensuring maximum power usage. In another embodiment, the redundant operations include read operations on a random access memory (RAM). In other embodiments, redundant operations may be performed with respect to other power-intensive subsystems.

20 Claims, 7 Drawing Sheets

(51) Int. Cl.
*H04L 29/08* (2006.01)
*H04L 67/1097* (2022.01)

(52) U.S. Cl.
CPC .......... *G11C 15/04* (2013.01); *H04L 67/1097* (2013.01); *G06F 3/0625* (2013.01)

(58) Field of Classification Search
CPC .......... G06F 8/00–78; G06F 9/00–548; G06F 11/00–3696; G06F 12/00–16; G06F 13/00–4295; G06F 15/00–825; G06F 16/00–986; G06F 17/00–40; G06F 21/00–88; G06F 2003/0691–0698; G06F 2009/3883; G06F 2009/45562–45595; G06F 2015/761–768; G06F 2201/00–885; G06F 2206/00–20; G06F 2209/00–549; G06F 2211/00–902; G06F 2212/00–7211; G06F 2213/00–4004; G06F 2216/00–17; G06F 2221/00–2153; G11B 20/00–24; G11B 33/00–1493; G11C 7/00–24; G11C 11/00–5692; G11C 13/00–06; G11C 14/00–009; G11C 15/00–06; G11C 16/00–3495; G11C 17/00–18; G11C 2207/00–229; G11C 2216/00–30; H04L 9/00–38; H04L 12/00–66; H04L 41/00–5096; H04L 49/00–9094; H04L 61/00–6095; H04L 67/00–42
See application file for complete search history.

(56) References Cited

U.S. PATENT DOCUMENTS

| | | | | |
|---|---|---|---|---|
| 6,657,878 | B2 * | 12/2003 | Lien | G11C 15/00 |
| | | | | 365/225.7 |
| 6,781,857 | B1 * | 8/2004 | Lien | G11C 15/00 |
| | | | | 365/189.07 |
| 7,149,101 | B1 * | 12/2006 | Om | G11C 15/00 |
| | | | | 365/49.1 |
| 7,362,129 | B1 | 4/2008 | Rahman | |
| 8,654,763 | B2 * | 2/2014 | Liu | H04L 45/00 |
| | | | | 370/389 |
| 9,377,510 | B2 | 6/2016 | Sonawane et al. | |
| 2003/0165073 | A1 * | 9/2003 | Lien | G11C 15/04 |
| | | | | 365/49.17 |
| 2004/0119521 | A1 | 6/2004 | Kurd et al. | |
| 2006/0106823 | A1 * | 5/2006 | Clark | G06F 11/2007 |
| 2012/0096220 | A1 * | 4/2012 | Liu | H04L 47/2441 |
| | | | | 711/108 |
| 2018/0091125 | A1 * | 3/2018 | Carlson | G06F 1/324 |
| 2020/0192456 | A1 | 6/2020 | Sugumar et al. | |

OTHER PUBLICATIONS

K. Flautner, Nam Sung Kim, S. Martin, D. Blaauw and T. Mudge, "Drowsy caches: simple techniques for reducing leakage power," Proceedings 29th Annual International Symposium on Computer Architecture, 2002, pp. 148-157. (Year: 2002).*

J. Fei and Y. Chu, "Double Hidden Layer Output Feedback Neural Adaptive Global Sliding Mode Control of Active Power Filter," in IEEE Transactions on Power Electronics, vol. 35, No. 3, pp. 3069-3084, Mar. 2020 (Year: 2020).*

E. Tian and C. Peng, "Memory-Based Event-Triggering H∞ Load Frequency Control for Power Systems Under Deception Attacks," in IEEE Transactions on Cybernetics, vol. 50, No. 11, pp. 4610-4618, Nov. 2020 (Year: 2020).*

A. S. Matveev and A. V. Savkin, "Stabilization of networked systems under computational power constraints," 2009 European Control Conference (ECC), 2009, pp. 1475-1480 (Year: 2009).*

U.S. Appl. No. 16/399,652, Non-Final Office Action dated Feb. 4, 2021.

* cited by examiner

FIG. 3    300

MEMORY-BASED POWER STABILIZATION IN A NETWORK DEVICE

PRIORITY CLAIM

This application claims benefit under 35 U.S.C. § 119(e) of Provisional Application No. 62/665,946, filed May 2, 2018, the entire contents of which is hereby incorporated by reference as if fully set forth herein.

TECHNICAL FIELD

Embodiments relate generally to power management, and, more specifically, to techniques for decreasing peak voltage requirements in a device.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

As the capabilities and numbers of components in computing devices grow, the power requirements of these devices tend to grow, as well. Since utilization of these capabilities and components changes over time, the amount of power consumed by the device also tends to change over time. For example, a networking device, such as a switch or router, may consume very little power when the device is not receiving much network traffic and/or when advanced packet processing is not needed or enabled. But when a large amount of traffic is received, and/or when the device is instructed to perform more advanced packet processing on that traffic, the power consumed by the device may increase greatly, and then decrease when the traffic subsides or the advanced packet processing is no longer needed.

Devices and components may be rated by a number of different power-related metrics, including average power, idle power, and peak power. Much progress has been achieved in reducing idle power and average power for many types of system components. However, system designs continue to be complicated by peak power demands. For example, modern integrated circuits and processors can be particularly power hungry components when providing advanced capabilities and/or processing large amounts of data at potentially very high clock frequencies.

The peak power rating of a device and its individual components is a significant design consideration, in that a device and/or its components must be able to provide at least the peak power, or risk intermittent failures. If the peak power needed for a certain desirable component is not available to the device (e.g. due to the power demands of other device components), the device must instead be designed to utilize a less power-hungry component, even if the less power-hungry component lacks certain desirable features or performance characteristics. Simply increasing the peak power available to the device or component is often not a viable solution, on account of associated expenses, space constraints, and/or other concerns. Hence, the peak power demands of a system component can make the difference between a commercially viable product and a non-commercially viable product.

Moreover, periods of peak power are often correlated with brief periods of time in which the voltage of a device droops or spikes (also known as voltage "transients"). Computing devices, and components thereof, must be designed to briefly tolerate or otherwise protect themselves from the minimum and maximum voltages that they can expect to receive during voltage droops and spikes. Generally, the higher the magnitude of the expected voltage droops or spikes, the more complicated the design and/or production of a device or component. The increasing complications may include, for instance, the addition of internal elements to deal with the voltage droops and spikes, the imposition of certain configuration limitations, increased testing costs as a result of more checks and/or design iterations before sign-off, increased production costs from the use additional or costlier materials or manufacturing processes, and so forth. The need to handle larger voltage spikes can even rule out designs that would otherwise lead to higher performance or increased functionality.

BRIEF DESCRIPTION OF THE DRAWINGS

The present inventive subject matter is illustrated by way of example, and not by way of limitation, in the figures of the accompanying drawings and in which like reference numerals refer to similar elements and in which.

DETAILED DESCRIPTION

Figure 1:
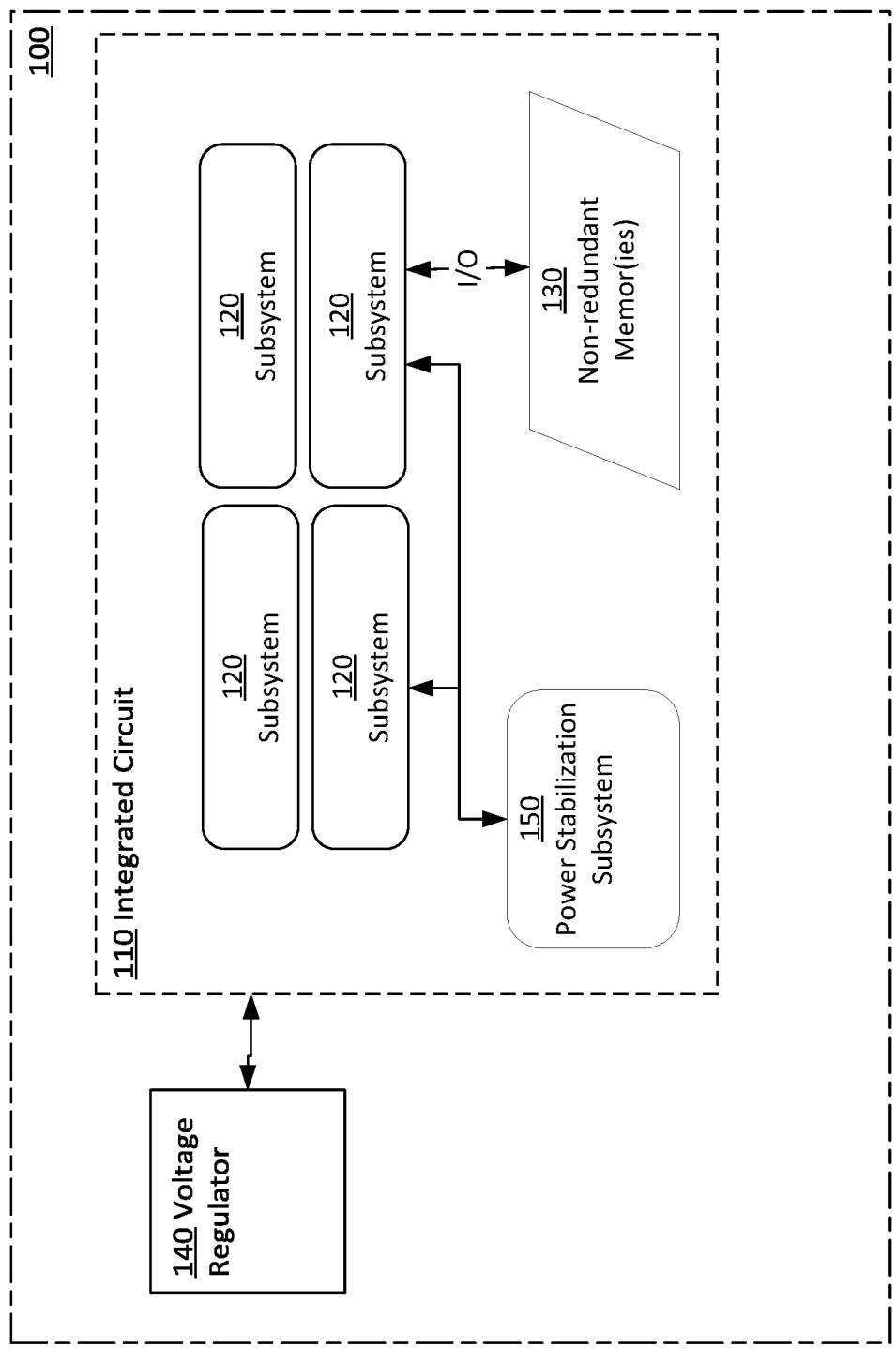
FIG. 1 is an illustrative view of various aspects of an example system in which the techniques described herein may be practiced.

In the following description, for the purposes of explanation, numerous specific details are set forth in order to provide a thorough understanding of the present inventive subject matter. It will be apparent, however, that the present inventive subject matter may be practiced without these specific details. In other instances, well-known structures and devices are shown in block diagram form in order to avoid unnecessarily obscuring the present inventive subject matter.

Embodiments are described herein according to the following outline:

1.0. General Overview
2.0. Structural Overview
   2.1. Integrated Circuit
   2.2. Voltage Regulator
   2.3. Power Stabilization Subsystem
   2.4. Unique CAM Considerations
   2.5. Unique RAM Considerations
   2.6. Miscellaneous
3.0. Functional Overview 3.1. General Flow
3.2. CAM-Specific Flow
4.0. Example Embodiments
5.0. Example Implementation Mechanism
  5.1. Network System
  5.2. Network Device
  5.3. Computer Hardware Overview
6.0. Extensions and Alternatives

1.0. General Overview

Approaches, techniques, and mechanisms are disclosed for stabilizing the power demands of a computing system, such as a device and/or a component thereof, by reducing the magnitude of certain types of voltage transients within the system. According to an embodiment, power demands may be stabilized by performing unnecessary or otherwise redundant operations during periods of otherwise low power demand. In so doing, the current load of the system remains relatively stable, which in turn greatly reduces voltage droops and overshoots resulting from drastic changes in the current load. Since peak voltage is typically realized during voltage overshoots, this may have the effect of reducing the peak voltage of the system, as well as the peak power rating of the system, which is calculated from the peak voltage.

In an embodiment, rather than add a redundant and otherwise unnecessary subsystem to the system, the power-stabilizing redundant operations are performed with respect to one or more existing subsystems within the device or component. In an embodiment, the state of a non-redundant power intensive subsystem is monitored. When it is determined that this power intensive subsystem is not being utilized, unnecessary or otherwise redundant operations, also referred to as "dummy" operations, are initiated to ensure that the power intensive subsystems remain utilized. The results of these operations are ignored and/or discarded. The redundant operations are discontinued upon detecting that the subsystem is again needed for its primary (i.e. non-redundant) intended use.

In some embodiments, the redundant operations are input/output (I/O) operations with respect to a memory of the system. In an embodiment, the redundant operations are selected so as not to change the state of the subsystem and/or have no side effects. For instance, in certain embodiments, the redundant operations include queries against a content addressable memory (CAM), such as a ternary content addressable memory (TCAM). In certain types of computing systems, such as network switches and routers, CAM lookups represent a relatively high proportion of the variable power usage of the system. To reduce overall power utilization, system designers conventionally strive to avoid unnecessary CAM use. Contrary to this expectation, in these certain embodiments, a CAM is kept active even when not needed. Consequently, depending on the percentage of area occupied by the CAM and/or the frequency of the CAM, the design may greatly reduce both current load variances in the device and the resulting voltage transients if redundant CAM search operations are initiated to replace idle CAM cycles. Such redundant CAM search operations may be executed with guaranteed misses in a good percentage of the entries in the CAM to provide power consumption for smoothing out the transients when transitioning to or from low activity cycles. Moreover, in an embodiment the queries may be designed to always miss, or at least be highly likely to always miss, many entries in the CAM, thereby ensuring maximum power usage.

In another embodiment, the redundant operations include read operations on a random access memory (RAM), such as a static random access memory (SRAM). For instance, when detecting periods of low power utilization (e.g. by determining that the number of operations in a pipeline or queue is below some threshold), redundant read operations on random or designated locations in an SRAM may be added. The results of the redundant read operations are discarded. In other embodiments, other I/O operations may be performed with respect to these or other memories to keep power stabilized. For instance, the I/O operations may be write operations on pre-defined addresses that do not change the functional state of the device. In yet other embodiments, redundant operations may instead or also be performed with respect to other power-intensive subsystems when detecting that those subsystems are currently, or soon predicted to be, idle.

2.0. Structural Overview

FIG. 1 is an illustrative view of various aspects of an example system 100 in which the techniques described herein may be practiced, according to an embodiment. System 100 is, or is a component within, a computing device, such as a network switch or router, gateway, server, or any other suitable computing apparatus.

2.1. Integrated Circuit

System 100 includes an integrated circuit 110. Integrated circuit 110 may be, for example, an application specific integrated circuit (ASIC), field-programmable gate array (FPGA), microprocessor, or any other suitable integrated circuit. Integrated circuit 110 may include a variety of subsystems 120 configured to provide a variety of functionality, including, without limitation, data processing logic, data manipulation logic, I/O logic, general-purpose processing logic, and so forth. In an embodiment where system 100 is part of a networking device, for example, the subsystems 120 may include specialized logic such as forwarding logic, traffic management logic, packet manipulation logic, prefix table lookup logic, and so forth.

At least some of these subsystems 120 may be coupled to one or more memories 130 that store data used in the operations performed by subsystems 120. These one or more memories 130 may include a variety of types of memory, including, without limitation, CAM, RAM, flash memory, read-only memory (ROM). In an embodiment, a memory 130 may be within the integrated circuit 110 itself to effectively reduce the peak current transient of system 110. In another embodiment, a memory 130 may nonetheless be an external component coupled to the integrated circuit 110. In an embodiment where system 100 is part of a networking device, for example, the subsystems 120 may include one or more TCAMs storing prefix tables and/or other network-related data and one or more SRAMs storing packet buffers and/or other types of network-related data.

At least some of subsystems 120 may be variable-power subsystems, in that they utilize varying degrees of power at varying times. For instance, a subsystem 120 may be in a low or idle-power state, in which it is performing relatively few or even no operations, and thus drawing minimal current. This subsystem 120 may, in response to input from other subsystems, begin performing more and more operations and/or relatively processing-intensive operations, and thus begin drawing higher amounts of current. The current drawn by the subsystem 120 is often a function of the number of operations being performed by a subsystem and/or the complexity of the operations performed. The current drawn by the integrated circuit 110 is, in turn, the sum of the current drawn by its constituent subsystems.

2.2. Voltage Regulator

Like many electrical components, integrated circuit 110 (or at least some of its constituent subsystems 120) requires a stable voltage to operate, usually referred to as the nominal voltage of the integrated circuit 110. Although minor variations in the operating voltage (e.g. depending on the internal sign-off criteria of the integrated circuit 110, less than 2%) are typically tolerated, larger variations can disrupt the operation of, or even destroy, the integrated circuit 110.

However, without adjusting the power usage of an integrated circuit 110, a change in the current draw of the integrated circuit 110 (e.g. as a result of a subsystem suddenly requiring more or less power to handle an increasing or decreasing workload) would require an inversely proportional change to the voltage, which would of course impact the stability of the voltage.

Accordingly, integrated circuit 110 is coupled to a voltage regulator 140. Voltage regulator 140 may take a variety of forms, such as a voltage regulator module. Voltage regulator 140 is configured to receive power from a power supply (not depicted) and provide that power to integrated circuit 110. Voltage regulator 140 provides that power at an approximately same voltage (i.e. the nominal voltage) the vast majority of the time. This voltage may be pre-configured, and/or set by a voltage identifier sent to the voltage regulator 140 by voltage identification logic within the integrated circuit 110.

Voltage regulator 140 is further configured to permit the integrated circuit 110 to draw variable amounts of current from the voltage regulator 140. To maintain voltage at or near the nominal voltage as the current demanded by integrated circuit 110 changes, voltage regulator 140 is configured with voltage sensing logic and a control loop to monitor and adjust the voltage being provided to integrated circuit 110 so that the voltage remains stable over time. Thus, for instance, a voltage regulator 140 may sense that, due to a step up in the current load demanded by the integrated circuit 110, the voltage being provided is decreasing. The voltage regulator 140 may then raise the voltage to compensate for the increased load, by increasing the power supplied to the integrated circuit 110.

Even with voltage regulator 140, however, a change in the current drawn by integrated circuit 110 leads to temporary voltage transients during the short period between the time when the current draw changes and the time when the voltage regulator 140 senses a change in voltage and compensates accordingly. In integrated circuits 110 where the current draw may change significantly in a very short period of time, the minimum or peak voltage reached during such a voltage transient can be particularly lower or higher, respectively, than the nominal operating voltage of the device. This problem is exacerbated even further in a low voltage integrated circuit 110. High quality voltage regulators 140 that sense and respond to voltage changes more quickly are expensive and consume valuable space. Even then, the magnitudes of voltage transients are merely reduced rather than eliminated.

Thus, even if the voltage regulator 140 is capable of stabilizing voltage quickly, computing devices, and components thereof, must still be designed to briefly tolerate or otherwise protect themselves from the minimum and maximum voltages that they can expect to receive during periods of changing current draw. For example, there may be a number of decoupling capacitors through which the current from the voltage regulator 140 must pass. Of course, larger and/or longer-lasting voltage transients demand greater and greater numbers of such capacitors.

2.3. Power Stabilization Subsystem

Integrated circuit 110 further comprises a power stabilization subsystem 150. Generally speaking, the power stabilization subsystem 150 reduces the magnitude of voltage transients by monitoring resource utilization by at least one of the various other subsystems 120 and identifying times when that utilization changes in some aspect that will significantly affect the demand current drawn by the integrated circuit 110. When this occurs, the power stabilization subsystem 150 causes the performance (or cessation of) a sufficient number of redundant operations at the one or more of the subsystems 150 so as to compensate, at least in part, for the change in the demand current.

Although not necessarily always the case, in an embodiment, the power stabilization subsystem 150 initiates redundant operations for the same subsystem 120 in which the power stabilization subsystem 150 observes the utilization changes. In this manner, the power stabilization subsystem 150 may be considered to stabilize the power demands of the monitored subsystems.

In an embodiment, the stabilized subsystem(s) 120 are non-redundant subsystems 120 (i.e. subsystems 120 that serve purposes other than power stabilization) selected based on the peak power they consume. For instance, the power stabilization subsystem 150 may be configured to stabilize the current demand of only the most power-intensive subsystem(s) 120. In an embodiment, other factors must also be considered in selecting which subsystems 120 to stabilize, such as the likelihood of interfering with normal operations of system 100, the amount of effort needed to initiate a suitable redundant operation, and so forth. Indeed, in some systems 100, significant advantages may be realized from stabilizing the current demand of just one subsystem 120 (or type of subsystem), whereas stabilizing the current demands of other subsystems 120 may prove too complicated to be worth the effort.

In an embodiment, the power stabilization subsystem 150 is configured to always maximize utilization of the monitored subsystems 120, thereby ensuring that the average power of the integrated circuit 110 never falls below the peak power of the monitored subsystems 120. That is, certain subsystems 120 are always kept active, even if not needed, so as to keep the current draw of the integrated circuit 110 from changing too drastically when transitioning the subsystem between active and inactive states. In other embodiments, the decision on how much activity to maintain at a subsystem 120 may be modulated by the configuration of the system 150, so as to balance the tradeoffs between increasing average power consumption and reducing peak power transients.

2.4. Unique CAM Considerations

As previously mentioned, CAM is one type of memory 130 that may be utilized by subsystems 120. CAM is a specialized type of high-speed memory that searches its entire contents in a very short period of time, such as a single clock cycle. Data stored in CAM can be accessed by performing a query for the content itself, and the memory retrieves the addresses where that data can be found.

A TCAM is a type of CAM. The term "ternary" in TCAM refers to the memory's ability to store and query data using three different inputs: 0, 1 and X. The "X" input, which is often referred to as a "don't care" or "wildcard" state, enables TCAM to perform broader searches based on pattern matching, as opposed to binary CAM, which performs exact-match searches using only 0s and 1s.

Due to its parallel nature, CAM (and by extension TCAM) provides greater flexibility than RAM. However, it is not widely used in most electronics because it consumes a lot of power and generates a high level of heat that must be dissipated. TCAMs are particularly useful in networking devices, however, and are thus often found in high-performance network switches, routers, and other networking devices, to increase the speed of route look-up, packet classification, packet forwarding, access control list-based commands, and other operations.

In certain embodiments, additional benefits may be realized in a network device where the power stabilization subsystem 150 is configured to keep active TCAM-based subsystems 120. TCAM lookups, such as for finding a longest matching prefix in a prefix table, are typically responsible for a significantly greater portion of the power consumed by such network devices than operations of other components of similar size. Moreover, due to the nature of the TCAM, keeping the power consumption of the TCAM from dropping requires only a simple lookup operation. This is because a single lookup on the TCAM searches all TCAM entries at once, in contrast to lookups in other memories, such as SRAM. Thus, the complexity of power stabilization logic for keeping the power consumption of the TCAM up is relatively simple to implement. That is, one simply needs to monitor whether a lookup operation has been issued to the TCAM over a time period short enough to ensure that the power consumption of the TCAM cannot fall idle (e.g., depending on the specifications of the TCAM, every clock cycle, every four clock cycles, etc.). If no lookup operation has been issued in that time period, then a redundant lookup operation is initiated. The result of the redundant lookup will be ignored and will not impact the logical functionality of the device.

For example, in an embodiment, the power stabilization subsystem 150 monitors lookup operations on a CAM-based memory 130, such as a TCAM used to store a lookup table. When it is determined that the CAM is going to be inactive, the power stabilization subsystem 150 initiates a redundant ("dummy") lookup on the CAM to keep the CAM active and the current draw of the CAM up. The lookup operation may be for any suitable value, as its results will be ignored by the power stabilization subsystem 150 (and any subsystem 120). Conversely, when it is determined that a non-redundant lookup operation on the CAM is needed (i.e. a lookup operation initiated by any subsystem 120 other than the power stabilization subsystem 150), the power stabilization subsystem 150 does not attempt to initiate a redundant lookup operation.

In an embodiment, the power stabilization subsystem 150 monitors and initiates dummy lookup operations at intervals frequent enough to ensure the current draw of the CAM does not fall. In an embodiment, this may require a hardware subsystem to poll the status of a CAM and initiate dummy lookup operations every clock cycle, every other clock cycle, every fourth clock cycle, or at any other suitable interval. In an embodiment, the power stabilization subsystem 150 monitors multiple CAMs, and initiates dummy lookups on multiple CAMs, or even all inactive CAMs. In an embodiment where dummy lookup operations are not needed every clock cycle for a given CAM, lookup operations to different CAMs may be staggered such that a different CAM, or set of CAMs, is hit every clock cycle.

In some embodiments, power consumption of the CAM is maximized when the lookup operation "misses" the CAM. That is to say, a lookup operation requires more power to execute when none of the entries in the CAM "matches" the lookup operation. This is because certain CAMs are optimized to only return a single match, as is the case in lookups for the longest prefix match in a prefix table. The CAMs are organized in such a manner that the first match is the best match (e.g. "longest" match), and hence the CAM preserves power by not directly comparing the query to the remaining CAM entries. If no match can be found, however, all CAM entries are evaluated directly, consuming maximum power. Hence, in some embodiments, the power stabilization subsystem 150 is configured such that the redundant lookup operation is a query that will always miss, or is highly likely to miss.

Depending on the context of operation and/or domain of values stored in the CAM, it may be possible to always query for a value that will not be found in the CAM. For instance, if a network switch is utilized in a context where the 248.0.0.0/10 is an impossible prefix to be found in a prefix table, a query could be made against the prefix table for 248.0.0.0/10. On the other hand, if there is not a value that can be guaranteed to always miss, there may nonetheless be a range or other set of values that are highly improbable to be found in the CAM. A query may be made for a random value from this set. In an embodiment, values may be selected for the set such that, if they are found, they will nonetheless be found towards the end of the list of values, thus assuring that at least a certain number of entries are evaluated.

In yet another embodiment, if the last value in the CAM may be continually monitored, the redundant query may be issued specifically for this last value, thus assuring all entries are evaluated. In another embodiment, the last query to the CAM may be repeated if no new queries are pending, so as to maintain power consumption of the CAM at its last level.

In another embodiment, an extra "redundant" bit or other-sized field is added to each CAM entry. Any CAM-based subsystem 120 that reads or writes to the CAM may be configured to always set this field to a specific value (e.g. 0 or 1). Hence, the power stabilization subsystem 150 may ensure a miss by not setting this field to the same specific value.

Figure 2:
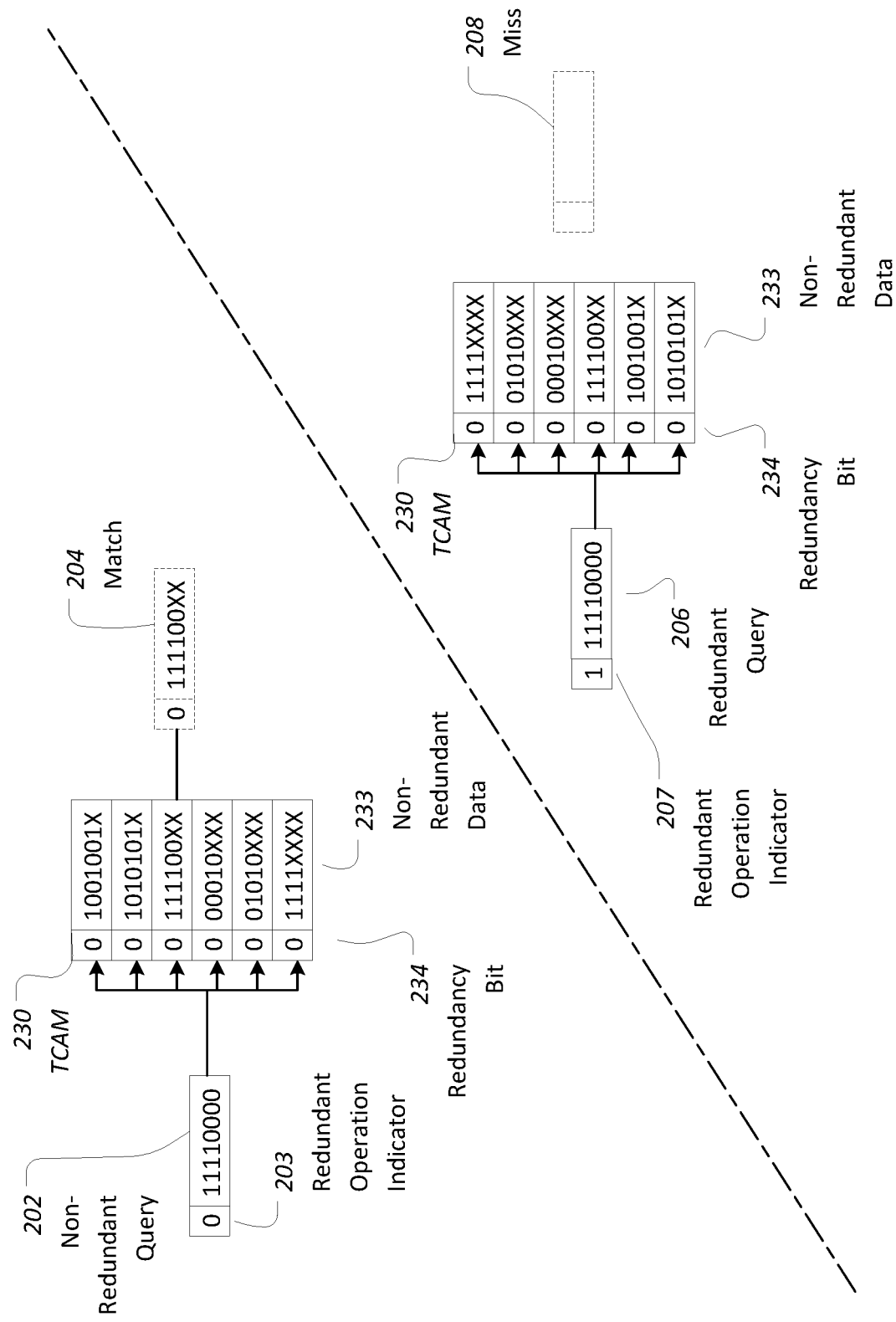
FIG. 2 illustrates the difference between a non-redundant ternary content addressable memory ("TCAM") lookup and a redundant TCAM lookup in an embodiment in which a TCAM is configured to include a redundant bit.

FIG. 2 illustrates the difference between a non-redundant TCAM lookup and a redundant TCAM lookup in an embodiment in which the TCAM is configured to include a redundant bit. FIG. 2 depicts two queries 202 and 206 on a TCAM 230. TCAM 230 may store any suitable set of entries. Each entry includes a key, consisting of non-redundant data 233, such as a prefix or other content, followed by a redundant bit 234. The redundant bit 234 is the same for all entries in the TCAM 230. The non-redundant data 233 is sorted by priority (e.g. prefix length) for matching purposes. Although the redundant bit 234 is shown at the end of the non-redundant data 233, the redundant bit 234 may in fact occur before or even within the non-redundant data 233.

Query 202 is a non-redundant query, such as may be issued by a subsystem 120 during the course of normal operation of system 100. For instance, query 202 may be a lookup to determine a longest prefix match for a packet destined to an address specified by query 202. Query 202 includes a non-redundant operation indicator 203, which is set to 0 to match the value of the redundant bit 234 in each entry of the TCAM 230. Of course, the value 0 has been chosen for illustrative purposes—the value may just as easily be 1 instead, so long as the value of the non-redundant operation indicator 203 matches the value of the redundant bit 234 in each entry of the TCAM 230. Query 202 is compared against each entry in TCAM 230 until arriving at matching entry 204, which is returned in response to the query 202.

Query 206 is a redundant query, such as may be issued by power stabilization subsystem 150 upon detecting that no non-redundant query 202 is pending. Query 206 includes a redundant operation indicator 207, which for illustrative purposes is set to 1, since it should not match the value of the redundant bit 234 in each entry of the TCAM 230. Query 202 is compared against each entry in TCAM 230. However, because of the value of redundant operation indicator 207, no match can be found, and a miss indicator 208 is returned. Power stabilization subsystem 150 may be configured to make sure that the result of the redundant operation is ignored by the intended logical functionality of the subsystem 120.

In an embodiment, a system 100 may include multiple CAMs, each serving a different purpose. For instance, one TCAM may store prefixes linked to forwarding instructions for packets matching those prefixes, another TCAM may be utilized for matching on an Access Control List, and a third TCAM may store entries that are linked to counters for metering, statistics, or any other attributes that may be needed in the lifecycle of packets matched to those entries. A power-stabilization subsystem 150 may be configured to stabilize the power consumed by each of these CAMs, only some of these CAMs, or even just one of these CAMs, depending on the embodiment.

While stabilizing the power consumption of TCAM-based subsystems provides significant benefits in certain types of network devices, it will also be realized that other types of computing devices that heavily utilize TCAMs, or even other types of CAMs, may likewise achieve similar results.

2.5. Unique RAM Considerations

As mentioned above, memory 130 may also or instead include one or more RAMs. In an embodiment, the power stabilization subsystem 150 monitors I/O operations on a RAM-based memory 130. The power stabilization subsystem 150 may be configured to monitor the number of operations, and keep the number of operations at approximately a certain level by adding redundant read operations when the number of pending non-redundant I/O operations falls below a certain level (e.g. the maximum number, or pre-defined percentage thereof, of possible concurrent I/O operations for a clock cycle or other designated period of time, the average number I/O operations executed over a recent period of time, etc.). If read operations are queued, redundant read operations may be marked with some indicator that instructs a subsystem 120 to cancel redundant read operation requests if the number of non-redundant I/O operations once again exceeds some threshold.

Unlike CAM, the number of RAM entries that can be read per clock cycle is relatively small in proportion to the size of RAM. Moreover, there is typically some queueing scheme that prioritizes the limited number of I/O operations that may be performed with RAM over any given period. Many different considerations go into this prioritization, and thus it may be difficult to know instantaneously if RAM is being fully utilized over any given time period. It may likewise be difficult to ensure that the redundant RAM operations are executed immediately, or if they will become obsolete before they can be executed due to an influx of new non-redundant operations.

Nonetheless, various logic may be employed to determine times when redundant RAM operations may be issued. For example, a system 100 may maintain one or more pipelines that dictate certain operations that are to occur over a next number of clock cycles. The power stabilization subsystem 150 may monitor one or more of these pipelines. When a pipeline is empty, the power stabilization subsystem 150 may at least partially fill the pipeline with redundant operations, including redundant memory reads. Or, the power stabilization subsystem 150 may include logic that directly or indirectly forecasts approximately how much power will be consumed in the near future based on the one or more pipelines. When it is deemed that there are not enough operations in the pipelines to sustain a desired level of power consumption (e.g., as may be indicated by the sheer number of operations pending, the scheduling of those operations, and/or the types of operations), additional memory reads (or other suitable operations) may be injected into the pipeline (s).

In an embodiment, the portion of the RAM that is read is a packet buffer. In another embodiment, redundant read operations are not limited to any specific portion of RAM. In another embodiment, an additional RAM may be added to the system for data backup purposes. This RAM may then be selected for redundant read and/or write operations as needed.

2.6. Miscellaneous

System 100 illustrates only one of many possible arrangements of components configured to provide the functionality described herein. Other arrangements may include fewer, additional, or different components, and the division of work between the components may vary depending on the arrangement. For example, in some embodiments, system 100 may comprise multiple integrated circuits 110. Each integrated circuit 110 may include its own power stabilization subsystem 150, or a shared power stabilization subsystem 150 may be utilized. Each integrated circuit 110 may further share a voltage regulator 140, or have its own voltage regulator 140.

In an embodiment, instead of keeping unneeded subsystems 120 always active, the power stabilization subsystem 150 may gradually let unneeded subsystems 120 fall inactive, rather than all at once. For instance, if integrated circuit 110 includes 10 TCAMs that all suddenly become inactive in a same clock cycle, the power stabilization subsystem 150 may choose to let only one of the TCAMs go inactive at that time, and make dummy lookups on the other TCAMs until a certain period of time has elapsed (e.g. the response time of the control loop of the voltage regulator). One by one, other TCAMs may be allowed to enter into an inactive state. Hence, the current draw of the integrated circuit 110 is observed to lower gradually instead of all at once, reducing the magnitude of the voltage overshoot. Similar techniques may be utilized for ramping down power consumption of other types of memories 130 and subsystems 120 that no longer need to be utilized.

Conversely, power stabilization 150 may be configured to gradually "ramp up" current draw so as to reduce voltage droops. However, it may be more difficult to gradually ramp up current draw of the integrated circuit 110, since it may be difficult to know in advance when subsystems 120 will become active. Nonetheless, if activation of subsystems 120 can be predicted (e.g. on account of other precipitating events), subsystems 120 that are predicted to be needed may be gradually activated in advance using redundant operations. Moreover, in an embodiment, power stabilization subsystem 150 may be able to delay certain non-redundant operations with respect to certain subsystems 120 so as to ramp up the current draw more slowly. In any event, there may be some benefit to gradually lowering the current draw of the integrated circuit 110, independent of whether the current draw may be gradually ramped up again when needed.

Although specific examples are given above with respect to stabilizing power through redundant I/O operations on a memory, other embodiments may utilize other types of redundant operations on other types of subsystems.

3.0. Functional Overview

3.1. General Flow

Figure 3:
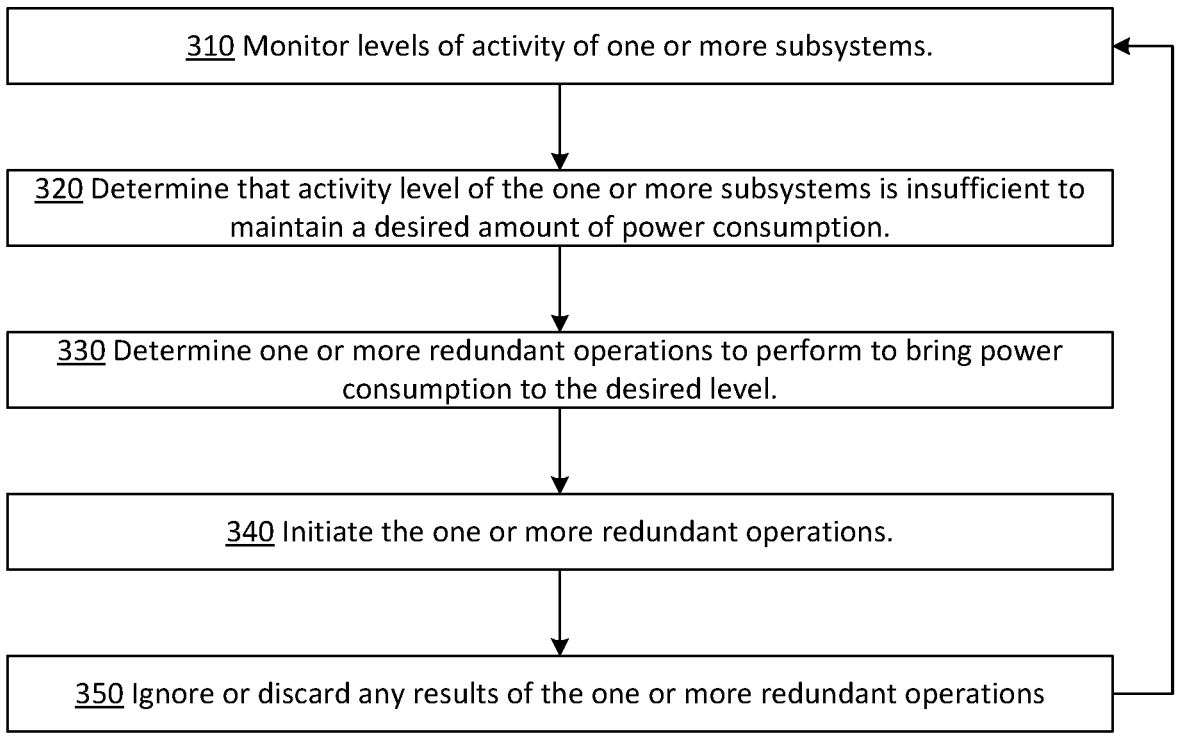
FIG. 3 illustrates an example flow for stabilizing the power consumption of a system.

FIG. 3 illustrates an example flow 300 for stabilizing the power consumption of a system, according to an embodiment. The various elements of flow 300 may be performed in a variety of systems, including systems such as system 100 described above. In an embodiment, each of the processes described in connection with the functional blocks described below may be implemented using one or more computer programs, other software elements, and/or digital logic in any of a general-purpose computer or a special-purpose computer, while performing data retrieval, transformation, and storage operations that involve interacting with and transforming the physical state of memory of the computer.

Block 310 comprises monitoring levels of activity with respect to operations performed by one or more subsystems of a system. The subsystems may include discrete logic within an integrated circuit, TCAM lookup subsystems, SRAM I/O subsystems, or even entire processors or integrated circuits. Said monitoring may include, for example, periodically examining queues or pipelines containing schedules of operations, receiving data from the subsystems indicating activity levels, determining activity levels by intercepting signals between the monitored subsystems and other subsystems, intercepting I/O requests, and so forth.

Block 320 comprising determining that the activity level of the one or more subsystems is at a level that is insufficient to maintain a desired amount of power consumption. Such a determination may be indirect. That is, a power stabilizing subsystem performing block 320 need not actually calculate or measure the power consumption of the one or more subsystems, but rather may simply consider certain activity levels and/or numbers of operations to be insufficient to maintain a desired amount of power consumption. For example, a subsystem may simply be considered inactive, in which case the subsystem may be considered to be consuming an insufficient level of power. Or if any two out of three monitored subsystems have an activity level below, for instance, 10%, the monitored subsystems may collectively be considered to be consuming an insufficient level of power.

In other embodiments, more complex rules may be utilized that, for example, sum and weight estimated power consumption levels of each subsystems.

Block 330 comprises determining one or more redundant operations to perform to bring power consumption to the desired level. In simpler embodiments, this block may be optional, as the set of possible redundant operations may be fixed. In other embodiments, this may involve, for example, determining how many read operations to issue to a group of memories, selecting which portions of memories to read, selecting a value to lookup in a TCAM, and so forth.

In an embodiment, the number of redundant operations selected may be a function of the level of activity determined in block 320. For example, if both a TCAM and a certain pipeline are inactive, then the redundant operations may include a TCAM lookup and a maximum number of redundant read operations on the pipeline. If, on the other hand, the TCAM is active while the pipeline is inactive, then the redundant operations may only include the redundant read operations. As another example, if the pipeline shows a moderate level of activity, then only a limited number of redundant read operations may be issued to the group of memories.

Depending on the embodiment and the context, the redundant operations may or may not be issued with respect to the same subsystems in which the low levels of activity were observed.

Block 340 comprises initiating the one or more redundant operations. This may involve, depending on the architecture of the implementing system, instructing the subsystems to perform new operations directly, adding new operations to pipelines and/or queues, sending a query directly to a CAM, issuing a read operation directly to a memory, or any other suitable steps.

Block 350 comprises ignoring or discarding any results of the one or more redundant operations. Flow then returns to block 310.

Flow 300 illustrates only one of many possible flows for stabilizing the power consumption of a system. Other flows may include fewer, additional, or different elements, in varying arrangements.

3.2. CAM-Specific Flow

Figure 4:
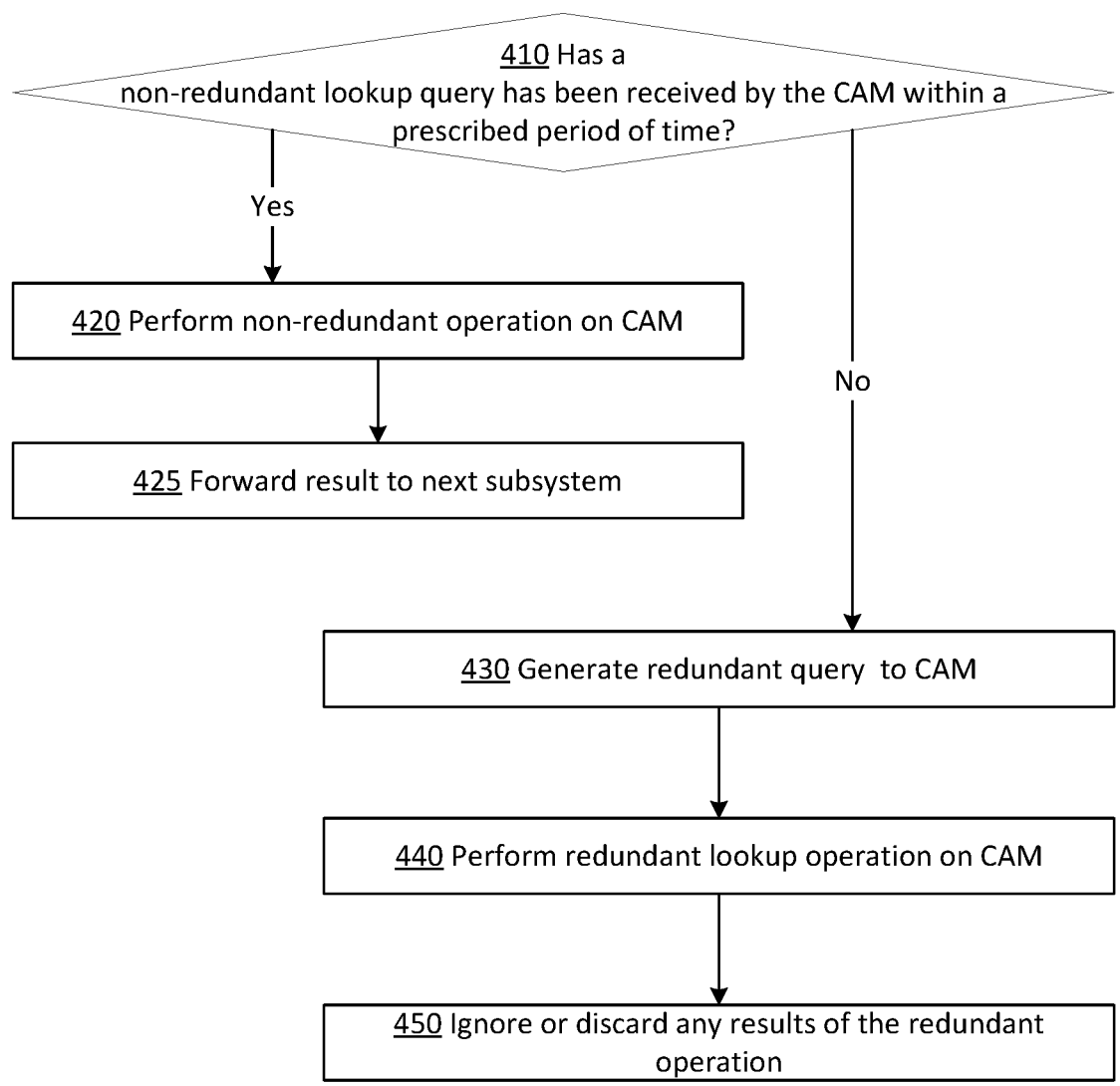
FIG. 4 illustrates an example flow for stabilizing the power consumption of a system through keeping one or more CAMs active even when not otherwise needed.

FIG. 4 illustrates an example flow 400 for stabilizing the power consumption of a system through keeping one or more CAMs active even when not otherwise needed, according to an embodiment. The various elements of flow 400 may be performed in a variety of systems, including systems such as system 100 described above. In an embodiment, flow 400 is particularly well suited for use in high performance network devices. In an embodiment, each of the processes described in connection with the functional blocks described below may be implemented using one or more computer programs, other software elements, and/or digital logic in any of a general-purpose computer or a special-purpose computer, while performing data retrieval, transformation, and storage operations that involve interacting with and transforming the physical state of memory of the computer.

Block 410 comprises determining whether a non-redundant lookup query has been received by the CAM within a prescribed period of time. This period of time may be, for instance, every clock cycle, every other clock cycle, every fourth clock cycle, or any other suitable period of time. In an embodiment, the period of time may be a function of an amount of time after which a CAM that has just performed a lookup query will cease drawing current. The lookup query is considered non-redundant if it is received from a subsystem of the implementing system other than a power stabilization subsystem, or if the results are intended for some other use than power stabilization. For instance, if the CAM stored prefixes for a network device, a query for the purpose of locating a next hop address, an access control list, or other rule or instruction for a longest prefix match would be considered non-redundant.

If a non-redundant lookup query is received in block 410, then flow 400 proceeds to block 420, in which the non-redundant lookup operation is performed. Block 425 then follows, in which a result is forwarded on to a next subsystem as a valid result. The next subsystem may be any configured to receive data output from the CAM, depending on the embodiment.

If a non-redundant lookup operation is not received in block 410, then flow 400 proceeds to block 430, in which a redundant lookup query is generated. As explained elsewhere, this query may be for a variety of values, depending on the embodiment. For instance, the query may be for a value that is certain to, or highly likely to, miss the TCAM. Or, as another example, the redundant query may be for a value that is guaranteed to require accessing a certain number of entries in the CAM, such as all entries, a majority of entries, the same number of entries accessed in the last query on the CAM, etc.

In block 440, this redundant lookup operation is performed. Block 450 comprises ignoring or discarding the results of the redundant lookup operation. For instance, depending on the configuration of the device circuitry, the result may be forwarded on a next subsystem, but marked as an invalid result that is to be ignored by that subsystem.

Flow 400 illustrates only one of many possible flows for stabilizing the power consumption of a system. Other flows may include fewer, additional, or different elements, in varying arrangements.

4.0. Example Embodiments

Examples of some embodiments are represented, without limitation, in the following clauses:

According to an embodiment, a system comprises: one or more power-consuming subsystems configured to process data; a power stabilization subsystem configured to monitor activities of the one or more power-consuming subsystems and, at times when an activity level of the one or more power-consuming subsystems are at a level corresponding to decreased power consumption, instruct at least one of the one or more power-consuming subsystems to perform redundant operations.

In an embodiment, the system further comprises: a voltage regulator configured to supply power to an integrated circuit comprising the one or more power-consuming subsystems, the voltage regulator increasing the power supplied to the integrated circuit in response to detecting a drop in voltage of the supplied power, the voltage regulator decreasing the power supplied to the integrated circuit in response to detecting a spike in the voltage of the supplied power; wherein the power stabilization subsystem is configured to prevent a drop in power consumed by the one or more power-consuming subsystems by issuing the redundant queries at the times when the activity levels are at levels corresponding to decreased power consumption, thereby reducing voltage spike magnitudes in the integrated circuit.

In an embodiment, the redundant operations are query operations on a content addressable memory.

In an embodiment, the redundant operations are memory access operations on a random access memory.

In an embodiment, the level corresponding to decreased power consumption is indicated by a number of non-redundant operations performed by the one or more power-consuming subsystems in a given time period.

According to an embodiment, a system comprises: a power-consuming subsystem configured to process data; a power stabilization subsystem configured to monitor operations of the power-consuming subsystem and, at times when a number of operations performed by the power-consuming subsystem in a given time-period is below a threshold, instruct the power-consuming subsystem to perform redundant operations.

According to an embodiment, a method comprises: monitoring activities of one or more power-consuming subsystems; at times when an activity level of the one or more power-consuming subsystems are at a level corresponding to decreased power consumption, instructing at least one of the one or more power-consuming subsystems to perform redundant operations.

In an embodiment, a method further comprises discarding results of the redundant operations.

According to an embodiment, a method comprises monitoring operations of a power-consuming subsystem; at times when a number of operations performed by the power-consuming subsystem in a given time-period is below a threshold, instructing the power-consuming subsystem to perform redundant operations.

According to an embodiment, a system comprises: a ternary content addressable memory; one or more subsystems configured to process network communications received via one or more ingress ports, the one or more subsystems configured to determine how to handle the network communications at least partially based on results from querying the ternary content addressable memory for network-related data; a power stabilization subsystem configured to monitor use of the ternary content addressable memory and, at times when the one or more subsystems are not querying the ternary content addressable memory, issue redundant queries to the ternary content addressable memory.

In an embodiment, a system further comprises: a voltage regulator configured to supply power to an integrated circuit comprising the one or more subsystems, the voltage regulator increasing the power supplied to the integrated circuit in response to detecting a drop in voltage of the supplied power, the voltage regulator decreasing the power supplied to the integrated circuit in response to detecting a spike in the voltage of the supplied power; wherein the power stabilization subsystem is configured to prevent a drop in power consumed by the ternary content addressable memory by issuing the redundant queries at the times when the one or more subsystems are not querying the ternary content addressable memory, thereby reducing voltage spike magnitudes in the integrated circuit.

In an embodiment, the ternary content addressable memory stores a prefix table.

In an embodiment, the redundant queries are for a value or values that are at least highly likely to miss the ternary content addressable memory.

In an embodiment, the redundant queries are for a value or values that are guaranteed to miss the ternary content addressable memory.

In an embodiment, each entry of the ternary content addressable memory includes a redundant field set to a first value, wherein the redundant queries set the redundant field to a different value than the first value.

In an embodiment, results of the redundant queries are discarded without further processing.

In an embodiment, the power stabilization subsystem is configured to ensure that at least one query is processed by the ternary content addressable memory within a given time period.

In an embodiment, the given time period is a number of clock cycles.

In an embodiment, a system further comprises: multiple ternary content addressable memories, each storing a different set of network-related data, wherein the power stabilization subsystem is configured to monitor and issue redundant queries to each of the multiple ternary content addressable memories.

In an embodiment, a system further comprises: a static random access memory storing network packet buffers, wherein the power stabilization subsystem is further configured to monitor use of the static random access memory in a pipeline of upcoming operations, and issue redundant read operations to the static random access memory based on an activity level of the static random access memory indicated by the pipeline.

In an embodiment, the system is an ASIC, FPGA, or other integrated circuit.

According to an embodiment, a method for reducing voltage transients in a network device comprises: monitoring use of a ternary content addressable memory by one or more subsystems in the network device, the one or more subsystems configured to determine how to handle network communications received by the network device at least partially based on results from querying the ternary content addressable memory for network-related data; determining times when the one or more subsystems are not querying the ternary content addressable memory; issuing redundant queries to the ternary content addressable memory at the determined times.

In an embodiment, a method further comprises, at the one or more subsystems: receiving data packets at forwarding logic within the one or more subsystems; querying a prefix table in the ternary content addressable memory for data indicating forwarding instructions mapped to longest prefix matches for destination addresses specified by the data packets; ignoring results of the redundant queries to the ternary content addressable memory.

In an embodiment, the redundant queries are for a value or values that are guaranteed to require accessing at least a majority of prefix entries in the prefix table.

In an embodiment, a method further comprises storing, in each entry of the prefix table, a redundant field, the redundant field being set to a first value for each entry in the prefix table, wherein queries to the prefix table for the data indicating the forwarding instructions set the redundant field to the first value, wherein the redundant queries set the redundant field to the second value.

In an embodiment, a method further comprises by said monitoring, determining, and issuing, ensuring that any given interval of time or clock cycles between the ternary content addressable memory processing queries does not exceed a certain size, the certain size being an amount of time or clock cycles after which the ternary content addressable memory will begin drawing less current if idle.

In an embodiment, a method further comprises performing the monitoring, determining, and issuing with respect to multiple ternary content addressable memories, each storing a different set of network-related data.

In an embodiment, a method further comprises: storing data in a static random access memory; monitoring use of the static random access memory in a pipeline of upcoming operations; issuing redundant read operations to the static random access memory based on an activity level of the static random access memory indicated by the pipeline.

In an embodiment, the ternary content addressable memory and the one or more subsystems are all components of a same integrated circuit.

Other examples of these and other embodiments are found throughout this disclosure.

5.0. Example Implementation Mechanism

5.1. Network System

Figure 5:
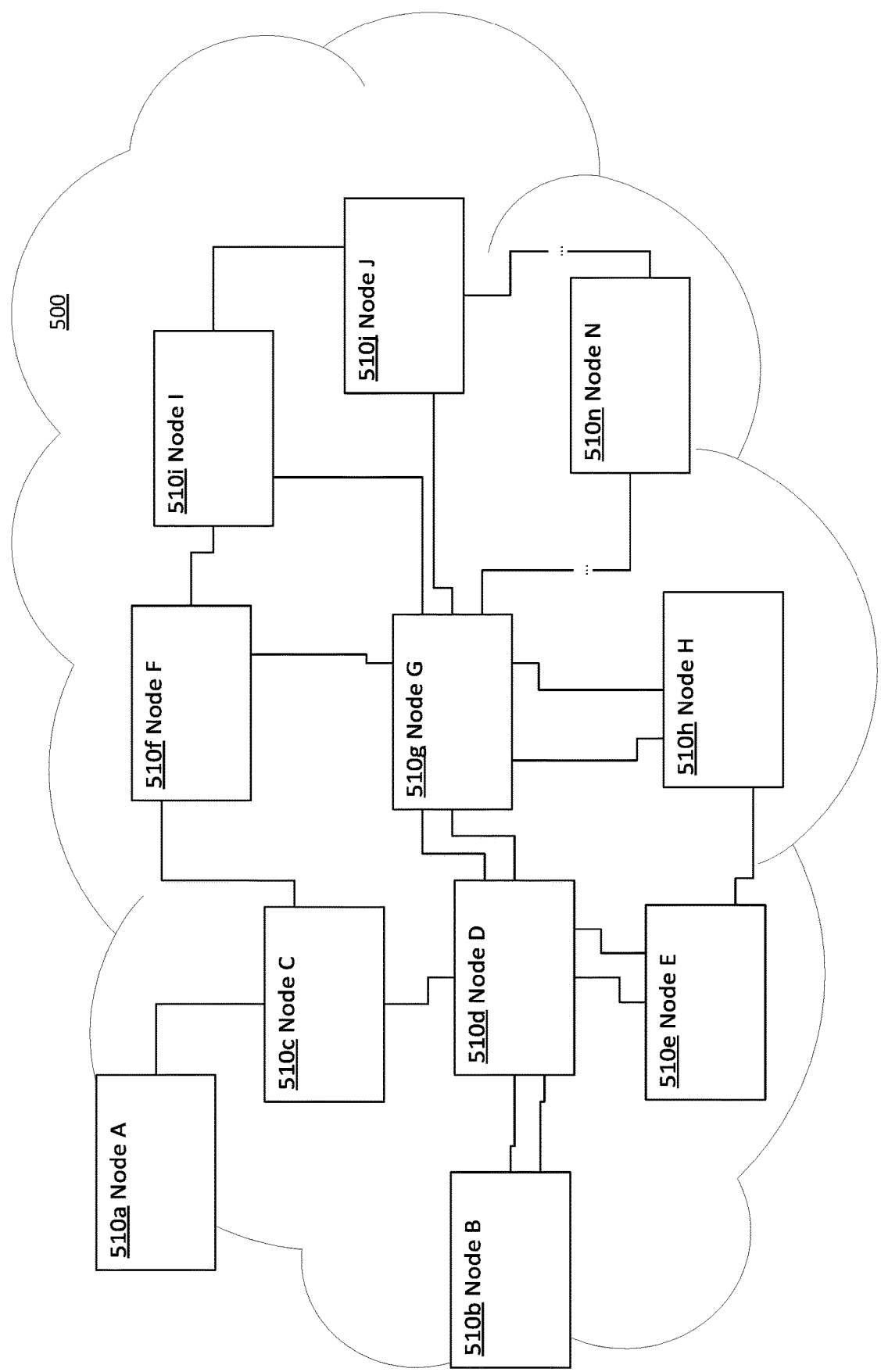
FIG. 5 is an illustrative view of various aspects of an example networking system in which the techniques described herein may be practiced.

FIG. 5 is an illustrative view of various aspects of an example networking system 500, also referred to as a network, in which the techniques described herein may be practiced, according to an embodiment. Networking system 500 comprises a plurality of interconnected nodes 510a-510n (collectively nodes 510), each implemented by a different computing device. In an embodiment, each node may comprise a system 100.

For example, a node 510 may be a single networking computing device, such as a router or switch, in which some or all of the processing components described herein are implemented using application-specific integrated circuits (ASICs) or field programmable gate arrays (FPGAs). As another example, a node 510 may include one or more memories storing instructions for implementing various components described herein, one or more hardware processors configured to execute the instructions stored in the one or more memories, and various data repositories in the one or more memories for storing data structures utilized and manipulated by the various components.

Each node 510 is connected to one or more other nodes 510 in network 500 by one or more communication links, depicted as lines between nodes 510. The communication links may be any suitable wired cabling or wireless links. Note that system 500 illustrates only one of many possible arrangements of nodes within a network. Other networks may include fewer or additional nodes 510 having any number of links between them.

Network Packets

While each node 510 may or may not have a variety of other functions, in an embodiment, each node 510 is configured to send, receive, and/or relay data to one or more other nodes 510 via these links. In general, data is communicated as series of discrete units or structures of data represented by signals transmitted over the communication links.

Different nodes 510 within a network 500 may send, receive, and/or relay data units at different communication levels, or layers. For instance, a first node 510 may send a data unit at the network layer (e.g. a TCP segment) to a second node 510 over a path that includes an intermediate node 510. This data unit 510 will be broken into smaller data units ("subunits") at various sublevels before it is transmitted from the first node 510. For example, the data unit may be broken into packets, then cells, and eventually sent out as a collection of signal-encoded bits to the intermediate device. Depending on the network type and/or the device type of the intermediate node 510, the intermediate node 510 may rebuild the entire original data unit before routing the information to the second node 510, or the intermediate node 510 may simply rebuild the subunits (e.g. packets or frames) and route those subunits to the second node 510 without ever composing the entire original data unit.

When a node 510 receives a data unit, it typically examines addressing information within the data unit (and/or other information within the data unit) to determine how to process the data unit. The addressing information may be, for instance, an Internet Protocol (IP) address, MPLS label, or any other suitable information. If the addressing information indicates that the receiving node 510 is not the destination for the data unit, the node may look up the destination node 510 within receiving node's routing information and route the data unit to another node 510 connected to the receiving node 510 based on forwarding instructions associated with the destination node 510 (or an address group to which the destination node belongs). The forwarding instructions may indicate, for instance, an outgoing port over which to send the packet, a label to attach the packet, etc. In cases where multiple paths to the destination node 510 are possible, the forwarding instructions may include information indicating a suitable approach for selecting one of those paths, or a path deemed to be the best path may already be defined.

Addressing information, flags, labels, and other metadata used for determining how to handle a data unit is typically embedded within a portion of the data unit known as the header. The header is typically at the beginning of the data unit, and is followed by the payload of the data unit, which is the information actually being sent in the data unit. A header is typically comprised of fields of different types, such as a destination address field, source address field, destination port field, source port field, and so forth. In some protocols, the number and the arrangement of fields may be fixed. Other protocols allow for arbitrary numbers of fields, with some or all of the fields being preceded by type information that explains to a node the meaning of the field.

A traffic flow is a sequence of data units, such as packets, from a source computer to a destination. In an embodiment, the source of the traffic flow may mark each data unit in the sequence as a member of the flow using a label, tag, or other suitable identifier within the data unit. In another embodiment, the flow is identified by deriving an identifier from other fields in the data unit (e.g. a "five-tuple" combination of a source address, source port, destination address, destination port, and protocol). A flow is often intended to be sent in sequence, and network devices are therefore typically configured to send all data units within a given flow along a same path to ensure that the flow is received in sequence.

For convenience, many of the techniques described in this disclosure are described with respect to routing IP packets in an L3 (level 3) network, in which context the described techniques have particular advantages. It will be recognized, however, that these techniques may also be applied to realize advantages in routing other types of data units conforming to other protocols and/or at other communication layers within a network. Thus, unless otherwise stated or apparent, the term "packet" as used herein should be understood to refer to any type of data structure communicated across a network, including packets as well as segments, cells, data frames, datagrams, and so forth.

Network Paths

Any node in the depicted network 500 may communicate with any other node in the network 500 by sending packets through a series of nodes 510 and links, referred to as a path. For example, Node B (510b) may send packets to Node H (510h) via a path from Node B to Node D to Node E to Node H. There may be a large number of valid paths between two nodes. For example, another path from Node B to Node H is from Node B to Node D to Node G to Node H.

In an embodiment, a node 510 does not actually need to specify a full path for a packet that it sends. Rather, the node 510 may simply be configured to calculate the best path for the packet out of the device (e.g. which egress port it should send the packet out on). When a node 510 receives a packet that is not addressed directly to the node 510, based on header information associated with a packet, such as path and/or destination information, the node 510 relays the packet along to either the destination node 510, or a "next hop" node 510 that the node 510 calculates is in a better position to relay the packet to the destination node 510. In this manner, the actual path of a packet is product of each node 510 along the path making routing decisions about how best to move the packet along to the destination node 510 identified by the packet.

5.2. Network Device

Figure 6:
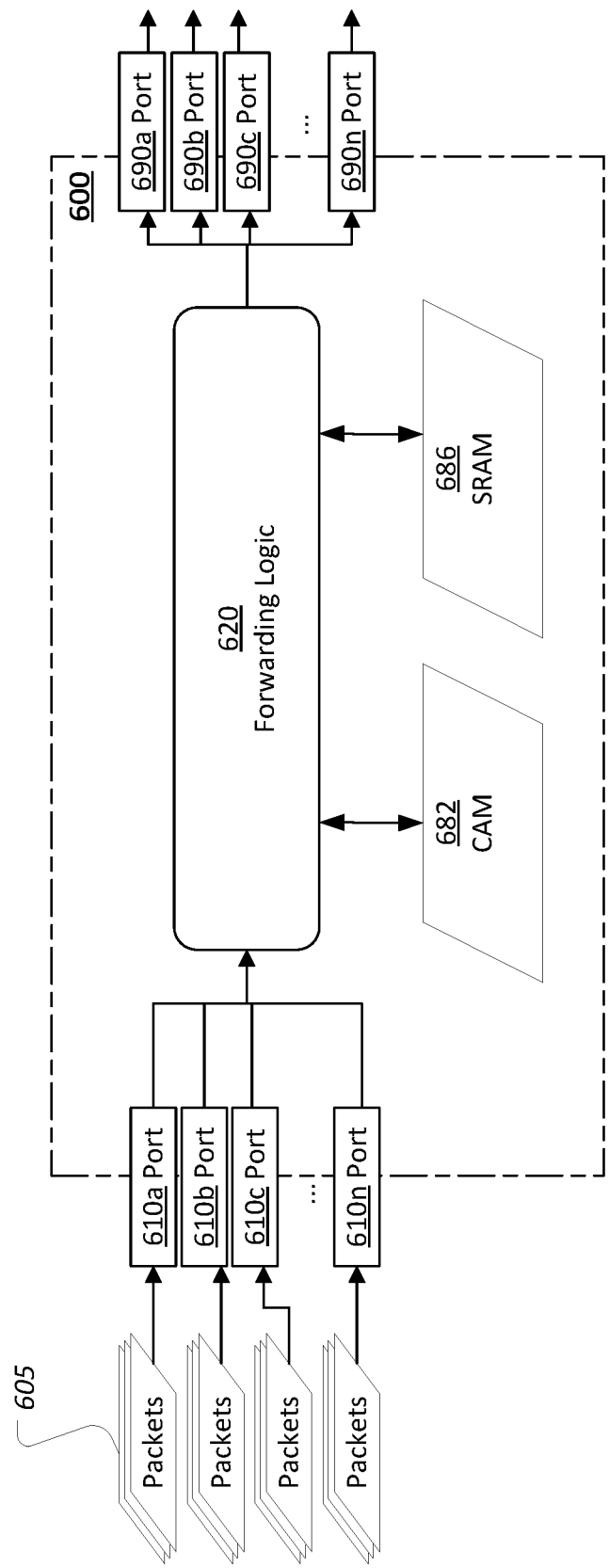
FIG. 6 is an illustrative view of various aspects of an example network device in which techniques described herein may be practiced.

FIG. 6 is an illustrative view of various aspects of an example network device 600 in which techniques described herein may be practiced, according to an embodiment. Network device 600 is a computing device comprising any combination of hardware and software configured to implement the various logical components described herein, including components 610-690. Note that, in an embodiment, some or all of the nodes 510 in system 500 may each be a separate network device 600 comprising a system 100.

Ports

Network device 600 includes ports 610/690. Ports 610, including ports 610a-n, are inbound ("ingress") ports by which data units referred to herein as packets 605 are received over a network, such as network 500. Ports 690, including ports 690a-n, are outbound ("egress") ports by which at least some of the packets 605 are sent out to other destinations within the network, after having been processed by the network device 600.

Ports 610/690 are depicted as separate ports for illustrative purposes, but may actually correspond to the same physical hardware ports on the network device 610. That is, a network device 600 may both receive packets 605 and send packets 605 over a single physical port, and the single physical port may thus function as both an ingress port 610 and egress port 690. Nonetheless, for various functional purposes, certain logic of the network device 600 may view a single physical port as a separate ingress port 610 and egress port 690. Moreover, for various functional purposes, certain logic of the network device 600 may subdivide a single ingress port 610 or egress port 690 into multiple ingress ports 610 or egress ports 690, or aggregate multiple ingress ports 610 or multiple egress ports 690 into a single ingress port 610 or egress port 690. Hence, in various embodiments, ports 610 and 690 should be understood as distinct logical constructs that are mapped to physical ports rather than simply as distinct physical constructs.

Traffic Management

Since not all packets 605 received by the device 600 can be processed at the same time, device 600 may store packets 605 in temporary memory structures referred to as buffers while the packets 605 are waiting to be processed. For example, the device's forwarding logic 620 may only be capable of processing a certain number of packets 605, or portions of packets 605, in a given clock cycle, meaning that other packets 605, or portions of packets 605, must either be ignored (i.e. dropped) or stored. At any given time, a large number of packets 605 may be stored in the buffers of the device 600, depending on network traffic conditions.

A buffer may be a portion of any type of memory, including volatile memory and/or non-volatile memory. For instance, in an embodiment, buffers may be stored in one or more SRAMs 686. Device 600 includes a buffer manager configured to manage use of buffers by device 600. Among other processing tasks, the buffer manager may, for example, allocate and deallocate specific segments of memory for buffers, create and delete buffers within that memory, identify available buffer(s) in which to store a newly received packet 605, maintain a mapping of buffers to packets 605 stored in those buffers (e.g. by a packet sequence number assigned to each packet 605 as the packet 605 is received), mark a buffer as available when a packet 605 stored in that buffer is dropped or sent from the device 600, determine when to drop a packet 605 instead of storing the packet 605 in a buffer, and so forth.

A packet 605, and the buffer(s) in which it is stored, is said to belong to a construct referred to as a queue. A queue may be a distinct, continuous portion of the memory in which buffers are stored. Or, a queue may instead be a set of linked memory locations (e.g. linked buffers). In some embodiments, the number of buffers assigned to a given queue at a given time may be limited, either globally or on a per-queue basis, and this limit may change over time.

The forwarding logic 620 of device 600 may process a packet 605 over one or more stages. A node may have many queues, and each stage of processing may utilize one or more of the queues to regulate which packet 605 is processed at which time. To this end, a queue arranges its constituent packets 605 in a sequence, such that each packet 605 corresponds to a different node in an ordered series of nodes. The sequence in which the queue arranges its constituent packets 605 generally corresponds to the sequence in which the packets 605 in the queue will be processed.

Forwarding Logic

A device 600 comprises one or more packet processing components that collectively implement forwarding logic 620 by which the device 600 is configured to determine how to handle each packet the device 600 receives. Forwarding logic 620, or portions thereof, may, in some instances, be hard-coded. For instance, specific hardware or software within the node may be configured to always react to certain types of data units in certain circumstances in a certain way. Forwarding logic 620, or portions thereof, may also be configurable, in that the logic 620 changes over time in response to data collected from or instructions received from other nodes in the network in which the device 600 is located.

For example, a device 600 will typically store in its memories one or more forwarding tables (or equivalent structures) that map certain data unit attributes or characteristics to actions to be taken with respect to data units having those attributes or characteristics, such as sending the data unit to a selected path, or processing the data unit using a specified internal component. For example, such attributes or characteristics may include a Quality-of-Service level specified by the data unit or associated with another characteristic of the data unit, a flow control group, an ingress port 610 through which the data unit was received, a tag or label in the packet's header, a source address, a destination address, a packet type, or any other suitable distinguishing property.

In an embodiment, forwarding logic 620 may read port state data. Port state data may include, for instance, flow control state information describing various traffic flows and associated traffic flow control rules or policies, link status information indicating links that are up or down, port utilization information indicating how ports are being utilized (e.g. utilization percentages, utilization states, etc.). Forwarding logic 620 may be configured to implement the associated rules or policies associated with the flow(s) to which a given packet belongs.

Forwarding logic 620 may process a data unit over multiple stages. At each stage, the data unit is placed in a buffer, which is said to belong to a queue. A device 600 may have many queues, and each stage of processing may utilize one or more of the queues. At any given processing stage, one or more packet processing components, such as a Field Programmable Gate Array (FPGA), Application-Specific Integrated Circuit (ASIC), or a general purpose processor executing software-based instructions, reads data units from associated queues and determines how to handle the data units.

In an embodiment, different queues may exist for different destinations. For example, each port 610 and/or port 690 may have its own set of queues. The queue to which an incoming packet 605 is assigned may therefore be selected based on the port 610 through which it was received, while the queue to which an outgoing packet is assigned may be selected based on forwarding information indicating which port 690 the packet should depart from. A different packet processor may be associated with each different set of one or more queues. Hence, the current processing context of the packet 605 may be used to select which queue a packet 605 should be assigned to.

In an embodiment, there may also or instead be different queues for different flows or sets of flows. That is, each identifiable traffic flow or group of traffic flows is assigned its own set of queues to which its packets 605 are respectively assigned. In an embodiment, different queues may correspond to different classes of traffic or quality-of-service (QoS) levels. Different queues may also or instead exist for any other suitable distinguishing property of the packets 605, such as source address, destination address, packet type, and so forth.

For instance, a data unit may be forwarded to another queue associated with another processing stage implemented by another set of processing components, sent out of the device 600 over an outbound port 690, discarded, delayed for flow control reasons, and so forth. The collective actions of these processing components over these multiple stages is said to implement the forwarding logic of the device 600.

In the course of processing a packet 605, a device 600 may replicate a packet 605 one or more times. For example, a packet 605 may be replicated for purposes such as multicasting, mirroring, debugging, and so forth. Thus, a single packet 605 may be replicated to multiple queues. Hence, though certain techniques described herein may refer to the original packet 605 that was received by the device 600, it will be understood that those techniques will equally apply to copies of the packet 605 that have been generated for various purposes.

As data units are routed through different nodes in a network, the nodes may, on occasion, discard, fail to send, or fail to receive data units, thus resulting in the data units failing to reach their intended destination. The act of discarding of a data unit, or failing to deliver a data unit, is typically referred to as "dropping" the data unit. Instances of dropping a data unit, referred to herein as "drops" or "packet loss," may occur for a variety of reasons, such as resource limitations, errors, or deliberate policies.

Forwarding Table

According to an embodiment, forwarding logic 620 reads certain instructions for handling network traffic from one or more forwarding tables. Generally, forwarding tables describe groups of one or more addresses, such as subnets of IPv4 or IPv6 addresses. Each address is an address of a network device on a network, though a network device may have more than one address. Each group is associated with a potentially different set of one or more actions to execute with respect to data units that resolve to (e.g. are directed to) an address within the group. Any suitable set of one or more actions may be associated with a group of addresses, including without limitation, forwarding a message to a specified "next hop," duplicating the message, changing the destination of the message, dropping the message, performing debugging or statistical operations, applying a quality of service policy or flow control policy, and so forth. In an embodiment, some or all of the stages of packet processing may have different forwarding tables specifying, for a given group of addresses, one or more instructions relevant to the stage.

For illustrative purposes, these tables are described as "forwarding tables," though it will be recognized that the extent of the action(s) described by tables may be much greater than simply where to forward the message. For example, in an embodiment, a table may be a basic forwarding table that simply specifies a next hop for each group. In other embodiments, a table may describe one or more complex policies for each group. Moreover, there may be different types of tables for different purposes. For instance, one table may be a basic forwarding table that is compared to the destination address of each packet, while another table may specify policies to apply to packets upon ingress based on their destination (or source) group, and so forth. In an embodiment, some or all of forwarding tables may be stored in one or more CAMs 682. In another embodiment, a forwarding table may be stored at least partially in a SRAM 686 or other type of memory.

In an embodiment, system 600 comprises path management control logic that is configured to adjust the forwarding instructions described by forwarding table based on a variety of factors. For example, path management control logic may be configured to recognize administrative commands that explicitly instruct the path management control logic to add or remove address groups or adjust existing instructions for a group. Such commands may originate from components that are external to system 600, such as from a system administrator or an administrative device. Such commands may also or instead originate from components that are internal to system 600. Path management control logic may also adjust forwarding instructions in response to events that imply changes to the forwarding instructions, such as the receipt of data units that announce the availability of new paths in a network, the dropping of a certain number of packets to a destination, the application of certain flow control measures, or any other suitable event.

Prefixes

In an embodiment, groups of addresses are described using an address prefix. This prefix is, in essence, a beginning address portion that is common to each address in the group. The beginning address portion may be, for instance, a first number of bits, bytes, or other element. As used herein, a "prefix entry" generally refers to a data entry (i.e. in a forwarding table) which maps a particular prefix to one or more actions to be performed with respect to network packets or other data structures associated with an input key (e.g. address) that matches the particular prefix. Thus, when determining how to handle a certain packet, forwarding logic 620 may determine a group of addresses that a data packet is associated with (e.g. a destination subnet, source subnet, etc.) using a prefix, and perform the one or more actions associated with that group.

For example, in the case of IP prefixes, a "slash notation", such as Classless Inter-Domain Routing (CIDR) notation, may be used to express a portion of an IP address that constitutes a prefix portion of the IP address. One example IP prefix may be expressed as "10.172.0.0/16", for instance, where the "/16" syntax indicates that the first 16 bits of the IP address 10.172.0.0 (corresponding to the "10.172" portion) are used to perform matches. The remaining 16 bits of the IP address 10.172.0.0 (the "0.0" portion) is treated as an arbitrary placeholder that is not used for matching. The prefix "10.172.0.0/16" thus matches the IP address "10.172.23.1" because the first 16 bits of both the prefix and IP address, when represented in bit form, are the same, but the same prefix does not match the IP address "10.170.3.28". In other words, a prefix matches an address if the address (when represented as a sequence of bits) begins with the prefix.

Multiple prefix entries may match the same network address. For example, a particular set of IP prefix entries stored by a networking device may include a first prefix entry specifying the prefix "178.0.0.0/8" and a second prefix entry specifying the prefix "178.132.2.0/24." The IP address "178.132.2.11" would match both of these prefixes. In instances where multiple prefix entries match a particular network address, forwarding logic 620 is generally configured to perform only the action(s) associated with the prefix entry specifying the longest prefix (i.e. the more specific prefix). This longest prefix is referred to as a longest prefix match. For instance, in this case, 178.132.2.0/24 is the longest prefix match for 178.132.2.11.

Forwarding logic 620 uses a longest prefix matching ("LPM") algorithm to locate the longest prefix match. At a high level, a longest prefix matching algorithm receives an input "key," often comprising a string, list, or array of numbers, characters, or bits, and determines which prefix from a set of prefixes is the longest prefix matching the input key. A prefix "matches" an input key for the purposes of a longest prefix match algorithm if the input key begins with the prefix. Using an example of an input key and set of prefixes that each comprise a string of letters, each of the prefixes "a", "axj", and "axjiiab" matches a hypothetical input key "axjiiabpo", whereas the prefixes "axy", "bxji", and "xjiiab" do not match the input key. The longest prefix match is the longest prefix that matches the input key.

A table that maps different prefixes to different data entries is referred to herein as a prefix table. In an embodiment, a forwarding table may be a prefix table, in that it matches IPv4 or IPv6 prefixes to forwarding instructions, policies, or other data.

5.3. Computer Hardware Overview

According to one embodiment, the techniques described herein are implemented by one or more special-purpose computing devices. The special-purpose computing devices may be desktop computer systems, portable computer systems, handheld devices, networking devices, or any other device that incorporates hard-wired and/or program logic to implement the techniques. The special-purpose computing devices may be hard-wired to perform the techniques, or may include digital electronic devices such as one or more application-specific integrated circuits (ASICs) or field programmable gate arrays (FPGAs) that are persistently programmed to perform the techniques. Such special-purpose computing devices may also combine custom hard-wired logic, ASICs, or FPGAs with custom programming to accomplish the techniques.

Though the foregoing techniques are described with respect to a hardware implementation, which provides a number of advantages in certain embodiments, it will also be recognized that, in another embodiment, the foregoing techniques may still provide certain advantages when performed partially or wholly in software. Accordingly, in such an embodiment, a suitable implementing apparatus comprises a general-purpose hardware processor and is configured to perform any of the foregoing methods by executing program instructions in firmware, memory, other storage, or a combination thereof.

Figure 7:
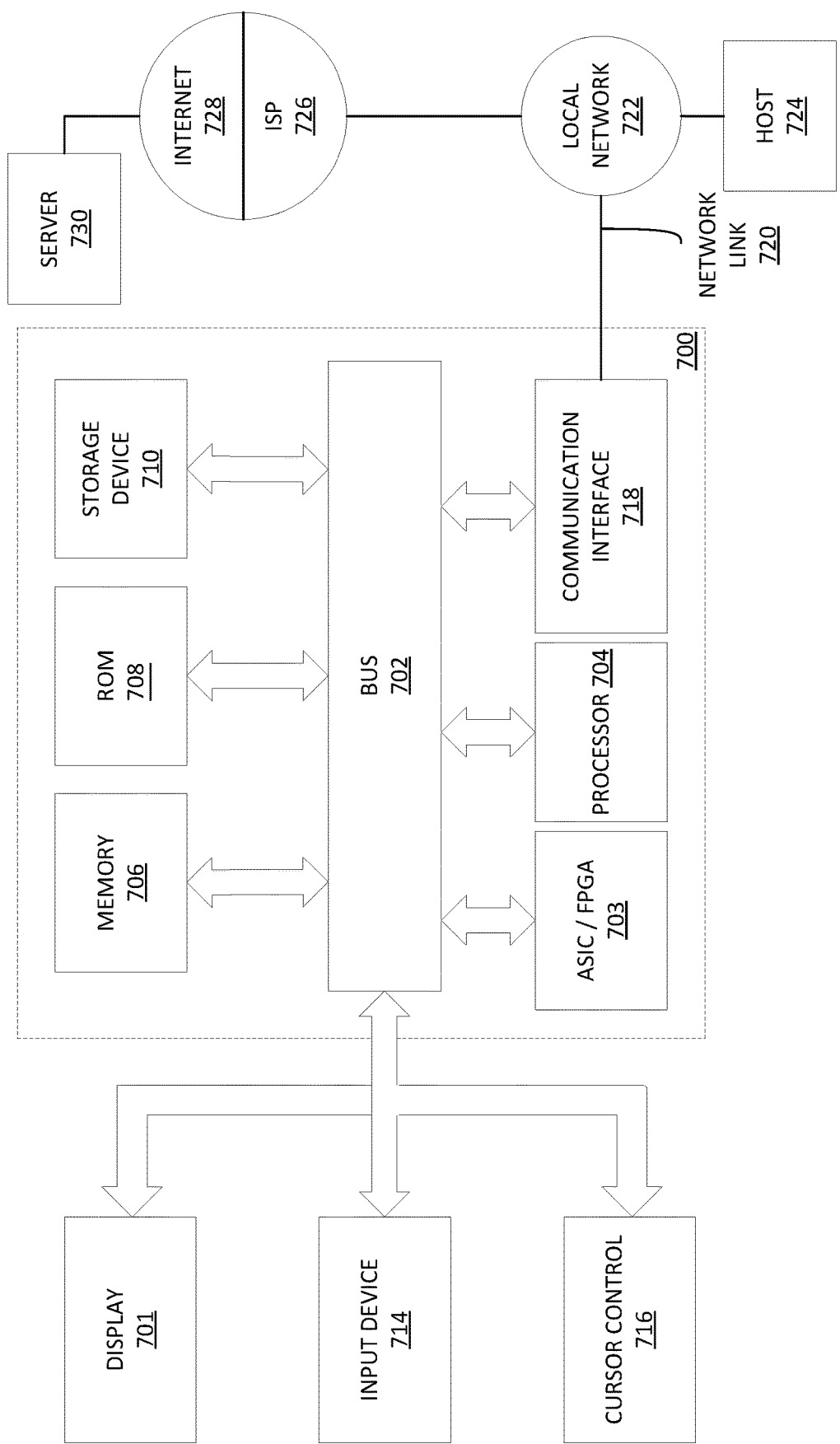
FIG. 7 is a block diagram that illustrates a computer system that may be utilized in implementing the above-described techniques.

FIG. 7 is a block diagram that illustrates a computer system 700 that may be utilized in implementing the above-described techniques, according to an embodiment. Computer system 700 may be, for example, a desktop computing device, laptop computing device, tablet, smartphone, server appliance, computing mainframe, multimedia device, handheld device, networking apparatus, or any other suitable device.

Computer system 700 may include one or more ASICs, FPGAs, or other specialized circuitry 703 for implementing program logic as described herein. For example, circuitry 703 may include fixed and/or configurable hardware logic blocks for implementing some or all of the described techniques, input/output (110) blocks, hardware registers or other embedded memory resources such as random access memory (RAM) for storing various data, and so forth. The logic blocks may include, for example, arrangements of logic gates, flip-flops, multiplexers, and so forth, configured to generate an output signals based on logic operations performed on input signals. Circuitry 703 may include, for instance, integrated circuit 110.

Additionally, and/or instead, computer system 700 may include one or more hardware processors 704 configured to execute software-based instructions. Computer system 700 may also include one or more busses 702 or other communication mechanism for communicating information. Busses 702 may include various internal and/or external components, including, without limitation, internal processor or memory busses, a Serial ATA bus, a PCI Express bus, a Universal Serial Bus, a HyperTransport bus, an Infiniband bus, and/or any other suitable wired or wireless communication channel.

Computer system 700 also includes one or more memories 706, such as a RAM, hardware registers, or other dynamic or volatile storage device for storing data units to be processed by the one or more ASICs, FPGAs, or other specialized circuitry 703. Memory 706 may also or instead be used for storing information and instructions to be executed by processor 704. Memory 706 may be directly connected or embedded within circuitry 703 or a processor 704. Or, memory 706 may be coupled to and accessed via bus 702. Memory 706 also may be used for storing temporary variables, data units describing rules or policies, or other intermediate information during execution of program logic or instructions.

Computer system 700 further includes one or more read only memories (ROM) 708 or other static storage devices coupled to bus 702 for storing static information and instructions for processor 704. One or more storage devices 710, such as a solid-state drive (SSD), magnetic disk, optical disk, or other suitable non-volatile storage device, may optionally be provided and coupled to bus 702 for storing information and instructions.

A computer system 700 may also include, in an embodiment, one or more communication interfaces 718 coupled to bus 702. A communication interface 718 provides a data communication coupling, typically two-way, to a network link 720 that is connected to a local network 722. For example, a communication interface 718 may be an integrated services digital network (ISDN) card, cable modem, satellite modem, or a modem to provide a data communication connection to a corresponding type of telephone line. As another example, the one or more communication interfaces 718 may include a local area network (LAN) card to provide a data communication connection to a compatible LAN. As yet another example, the one or more communication interfaces 718 may include a wireless network interface controller, such as a 702.11-based controller, Bluetooth controller, Long Term Evolution (LTE) modem, and/or other types of wireless interfaces. In any such implementation, communication interface 718 sends and receives electrical, electromagnetic, or optical signals that carry digital data streams representing various types of information.

Network link 720 typically provides data communication through one or more networks to other data devices. For example, network link 720 may provide a connection through local network 722 to a host computer 724 or to data equipment operated by a Service Provider 726. Service Provider 726, which may for example be an Internet Service Provider (ISP), in turn provides data communication services through a wide area network, such as the world wide packet data communication network now commonly referred to as the "Internet" 728. Local network 722 and Internet 728 both use electrical, electromagnetic or optical signals that carry digital data streams. The signals through the various networks and the signals on network link 720 and through communication interface 718, which carry the digital data to and from computer system 700, are example forms of transmission media.

In an embodiment, computer system 700 can send packets and receive data through the network(s), network link 720, and communication interface 718. In some embodiments, this data may be data units that the computer system 700 has been asked to process and, if necessary, redirect to other computer systems via a suitable network link 720. In other embodiments, this data may be instructions for implementing various processes related to the described techniques. For instance, in the Internet example, a server 730 might transmit a requested code for an application program through Internet 728, ISP 726, local network 722 and communication interface 718. The received code may be executed by processor 704 as it is received, and/or stored in storage device 710, or other non-volatile storage for later execution. As another example, information received via a network link 720 may be interpreted and/or processed by a software component of the computer system 700, such as a web browser, application, or server, which in turn issues instructions based thereon to a processor 704, possibly via an operating system and/or other intermediate layers of software components.

Computer system 700 may optionally be coupled via bus 702 to one or more displays 77 for presenting information to a computer user. For instance, computer system 700 may be connected via an High-Definition Multimedia Interface (HDMI) cable or other suitable cabling to a Liquid Crystal Display (LCD) monitor, and/or via a wireless connection such as peer-to-peer Wi-Fi Direct connection to a Light-Emitting Diode (LED) television. Other examples of suitable types of displays 77 may include, without limitation, plasma display devices, projectors, cathode ray tube (CRT) monitors, electronic paper, virtual reality headsets, braille terminal, and/or any other suitable device for outputting information to a computer user. In an embodiment, any suitable type of output device, such as, for instance, an audio speaker or printer, may be utilized instead of a display 77.

One or more input devices 714 are optionally coupled to bus 702 for communicating information and command selections to processor 704. One example of an input device 714 is a keyboard, including alphanumeric and other keys.

Another type of user input device 714 is cursor control 716, such as a mouse, a trackball, or cursor direction keys for communicating direction information and command selections to processor 704 and for controlling cursor movement on display 77. This input device typically has two degrees of freedom in two axes, a first axis (e.g., x) and a second axis (e.g., y), that allows the device to specify positions in a plane. Yet other examples of suitable input devices 714 include a touch-screen panel affixed to a display 77, cameras, microphones, accelerometers, motion detectors, and/or other sensors. In an embodiment, a network-based input device 714 may be utilized. In such an embodiment, user input and/or other information or commands may be relayed via routers and/or switches on a Local Area Network (LAN) or other suitable shared network, or via a peer-to-peer network, from the input device 714 to a network link 720 on the computer system 700.

As discussed, computer system 700 may implement techniques described herein using customized hard-wired logic, one or more ASICs or FPGAs 703, firmware and/or program logic, which in combination with the computer system causes or programs computer system 700 to be a special-purpose machine. According to one embodiment, however, the techniques herein are performed by computer system 700 in response to processor 704 executing one or more sequences of one or more instructions contained in main memory 706. Such instructions may be read into main memory 706 from another storage medium, such as storage device 710. Execution of the sequences of instructions contained in main memory 706 causes processor 704 to perform the process steps described herein.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 710. Volatile media includes dynamic memory, such as main memory 706. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 702. Transmission media can also take the form of acoustic or light waves, such as those generated during radio-wave and infra-red data communications.

Various forms of media may be involved in carrying one or more sequences of one or more instructions to processor 704 for execution. For example, the instructions may initially be carried on a magnetic disk or solid state drive of a remote computer. The remote computer can load the instructions into its dynamic memory and use a modem to send the instructions over a network, such as a cable network or cellular network, as modulated signals. A modem local to computer system 700 can receive the data on the network and demodulate the signal to decode the transmitted instructions. Appropriate circuitry can then place the data on bus 702. Bus 702 carries the data to main memory 706, from which processor 704 retrieves and executes the instructions.

The instructions received by main memory 706 may optionally be stored on storage device 710 either before or after execution by processor 704.

6.0. Extensions and Alternatives

As used herein, the terms "first," "second," "certain," and "particular" are used as naming conventions to distinguish queries, plans, representations, steps, objects, devices, or other items from each other, so that these items may be referenced after they have been introduced. Unless otherwise specified herein, the use of these terms does not imply an ordering, timing, or any other characteristic of the referenced items.

In the drawings, the various components are depicted as being communicatively coupled to various other components by arrows. These arrows illustrate only certain examples of information flows between the components. Neither the direction of the arrows nor the lack of arrow lines between certain components should be interpreted as indicating the existence or absence of communication between the certain components themselves. Indeed, each component may feature a suitable communication interface by which the component may become communicatively coupled to other components as needed to accomplish any of the functions described herein.

In the foregoing specification, embodiments of the inventive subject matter have been described with reference to numerous specific details that may vary from implementation to implementation. Thus, the sole and exclusive indicator of what is the inventive subject matter, and is intended by the applicants to be the inventive subject matter, is the set of claims that issue from this application, in the specific form in which such claims issue, including any subsequent correction. In this regard, although specific claim dependencies are set out in the claims of this application, it is to be noted that the features of the dependent claims of this application may be combined as appropriate with the features of other dependent claims and with the features of the independent claims of this application, and not merely according to the specific dependencies recited in the set of claims. Moreover, although separate embodiments are discussed herein, any combination of embodiments and/or partial embodiments discussed herein may be combined to form further embodiments.

Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A network switching apparatus implemented by an integrated circuit, the network switching apparatus comprising:
   a ternary content addressable memory;
   a plurality of subsystems, including forwarding logic, traffic management logic, packet manipulation logic, and prefix table lookup logic, configured to process network communications received via one or more ingress ports, the plurality of subsystems configured to determine how to handle the network communications at least partially based on results from querying the ternary content addressable memory for network-related data;

a power stabilization subsystem configured to monitor use of the plurality of subsystems and the ternary content addressable memory and, at times when an activity level of the plurality of subsystems falls below a threshold level, when the plurality of subsystems are not querying the ternary content addressable memory, issue redundant queries to the ternary content addressable memory.

2. The network switching apparatus of claim 1, further comprising:
a voltage regulator configured to supply power to the integrated circuit comprising the plurality of subsystems, the voltage regulator increasing the power supplied to the integrated circuit in response to detecting a drop in voltage of the supplied power, the voltage regulator decreasing the power supplied to the integrated circuit in response to detecting a spike in the voltage of the supplied power;
wherein the power stabilization subsystem is configured to maintain a desired amount of power consumed by the network switching apparatus by issuing the redundant queries at the times when the activity level is below the threshold level, thereby reducing voltage spike magnitudes in the integrated circuit.

3. The network switching apparatus of claim 1, wherein the ternary content addressable memory stores a prefix table.

4. The network switching apparatus of claim 1, wherein the redundant queries are for a value or values that are at least highly likely to miss the ternary content addressable memory.

5. The network switching apparatus of claim 1, wherein each entry of the ternary content addressable memory includes a redundant field set to a first value, wherein the redundant queries set the redundant field to a different value than the first value.

6. The network switching apparatus of claim 1, wherein results of the redundant queries are discarded without further processing.

7. The network switching apparatus of claim 1, wherein the power stabilization subsystem is configured to ensure that at least one query is processed by the ternary content addressable memory within each given time period of a plurality of successive time periods in which the network switching apparatus is in operation.

8. The network switching apparatus of claim 1, further comprising multiple ternary content addressable memories, each storing a different set of network-related data, wherein the power stabilization subsystem is configured to monitor and issue redundant queries to each of the multiple ternary content addressable memories, the number of the multiple ternary content addressable memories to which the power stabilization subsystem issues the redundant queries being a function of the activity level.

9. The network switching apparatus of claim 1, further comprising:
a static random access memory storing network packet buffers, the static random access memories being different from the ternary content addressable memory;
wherein the power stabilization subsystem is further configured to monitor use of the static random access memory in a pipeline of upcoming operations, and issue redundant read operations to the static random access memory based on an activity level of the static random access memory indicated by the pipeline.

10. The network switching apparatus of claim 1, wherein the network switching apparatus comprises a plurality of integrated circuits, including the integrated circuit, wherein the integrated circuit is an ASIC or FPGA.

11. A method for reducing voltage transients in a network switching apparatus implemented by an integrated circuit, the method comprising:
monitoring use of a ternary content addressable memory and a plurality of subsystems in the network switching apparatus, the plurality of subsystems configured to determine how to handle network communications received by the network switching apparatus at least partially based on results from querying the ternary content addressable memory for network-related data, the plurality of subsystems including forwarding logic, traffic management logic, packet manipulation logic, and prefix table lookup logic;
based on the monitoring, determining an activity level of the plurality of subsystems;
determining times when the activity of the level of the plurality of subsystems falls below a threshold level and the plurality of subsystems is not querying the ternary content addressable memory;
issuing redundant queries to the ternary content addressable memory at the determined times.

12. The method of claim 11, further comprising, at the plurality of subsystems:
receiving data packets at forwarding logic within the plurality of subsystems;
querying a prefix table in the ternary content addressable memory for data indicating forwarding instructions mapped to longest prefix matches for destination addresses specified by the data packets;
ignoring results of the redundant queries to the ternary content addressable memory.

13. The method of claim 12, wherein the redundant queries are for a value or values that are guaranteed to require accessing at least a majority of prefix entries in the prefix table.

14. The method of claim 12, further comprising storing, in each entry of the prefix table, a redundant field, the redundant field being set to a first value for each entry in the prefix table, wherein queries to the prefix table for the data indicating the forwarding instructions set the redundant field to the first value, wherein the redundant queries set the redundant field to the second value.

15. The method of claim 12, further comprising, by the monitoring, determining, and issuing, ensuring that, over a plurality of time periods, any given interval of time or clock cycles between the ternary content addressable memory processing queries does not exceed a certain size, the certain size being an amount of time or clock cycles after which the ternary content addressable memory will begin drawing less current if idle.

16. The method of claim 11, further comprising performing the monitoring, determining, and issuing with respect to multiple ternary content addressable memories, each storing a different set of network-related data.

17. The method of claim 11, further comprising:
storing data in a static random access memory;
monitoring use of the static random access memory in a pipeline of upcoming operations;
issuing redundant read operations to the static random access memory based on the activity level of the static random access memory indicated by the pipeline.

18. The method of claim 11, wherein the ternary content addressable memory and the plurality of subsystems are all components of a same integrated circuit.

19. One or more non-transitory computer readable media storing instructions for reducing voltage transients in a network switching apparatus implemented by an integrated circuit, wherein the instructions, when executed by the network switching apparatus, cause performance of:

monitoring use of a ternary content addressable memory and a plurality of subsystems in the network switching apparatus, the plurality of subsystems configured to determine how to handle network communications received by the network switching apparatus at least partially based on results from querying the ternary content addressable memory for network-related data, the plurality of subsystems including forwarding logic, traffic management logic, packet manipulation logic, and prefix table lookup logic;

based on the monitoring, determining an activity level of the plurality of subsystems;

determining times when the activity of the level of the plurality of subsystems falls below a threshold level and the plurality of subsystems is not querying the ternary content addressable memory;

issuing redundant queries to the ternary content addressable memory at the determined times.

20. The one or more non-transitory computer readable media of claim 17, wherein the instructions, when executed by the network switching apparatus, further cause performance of:

receiving data packets at forwarding logic within the plurality of subsystems;

querying a prefix table in the ternary content addressable memory for data indicating forwarding instructions mapped to longest prefix matches for destination addresses specified by the data packets;

ignoring results of the redundant queries to the ternary content addressable memory.

* * * * *